US012206059B2

(12) United States Patent
Lin et al.

(10) Patent No.: US 12,206,059 B2
(45) Date of Patent: Jan. 21, 2025

(54) LIGHT EMITTING ELEMENT PACKAGE INCLUDING SUBSTRATE WITH EDGE NOTCH AND DISPLAY DEVICE INCLUDING LIGHT EMITTING ELEMENT PACKAGE

(71) Applicant: Lextar Electronics Corporation, Hsinchu (TW)

(72) Inventors: Chih-Hao Lin, Hsinchu (TW); Wei-Yuan Ma, Hsinchu (TW); Jo-Hsiang Chen, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 338 days.

(21) Appl. No.: 17/666,513

(22) Filed: Feb. 7, 2022

(65) Prior Publication Data

US 2022/0254973 A1 Aug. 11, 2022

(30) Foreign Application Priority Data

Feb. 8, 2021 (TW) ................................. 110104804

(51) Int. Cl.
*H01L 33/62* (2010.01)
*H01L 27/15* (2006.01)
*H01L 33/00* (2010.01)
*H01L 33/54* (2010.01)

(52) U.S. Cl.
CPC ............ *H01L 33/62* (2013.01); *H01L 27/156* (2013.01); *H01L 33/005* (2013.01); *H01L 33/54* (2013.01); *H01L 2933/005* (2013.01); *H01L 2933/0066* (2013.01)

(58) Field of Classification Search
None
See application file for complete search history.

(56) References Cited

U.S. PATENT DOCUMENTS

| 9,755,110 B1 | 9/2017 | Crowder et al. |
| 9,825,202 B2 | 11/2017 | Schuele et al. |
| 10,170,664 B2 | 1/2019 | Schuele et al. |
| 10,211,364 B2 | 2/2019 | Schuele et al. |
| 10,446,716 B2 | 10/2019 | Lin et al. |
| 2009/0085183 A1* | 4/2009 | Mitchell ................. H01L 23/10 257/E23.18 |

(Continued)

FOREIGN PATENT DOCUMENTS

| CN | 110710003 A | 1/2020 |
| CN | 111462651 A | 7/2020 |

(Continued)

*Primary Examiner* — Scott B Geyer
(74) *Attorney, Agent, or Firm* — CKC & Partners Co., LLC

(57) ABSTRACT

A light emitting element package includes a first substrate, at least one light emitting element, an encapsulation layer, and a plurality of conductive pads. The first substrate has an upper surface and a lower surface opposite to each other, in which an edge of the lower surface has a notch. The at least one light emitting element is disposed on the upper surface of the first substrate, in which the light emitting element has a positive electrode and a negative electrode. The encapsulation layer covers the light emitting element. The plurality of conductive pads are disposed on the lower surface of the first substrate and electrically connected to the positive electrode and the negative electrode of the light emitting element, respectively.

13 Claims, 9 Drawing Sheets

(56) References Cited

U.S. PATENT DOCUMENTS

| | | | |
|---|---|---|---|
| 2010/0148206 A1* | 6/2010 | Lin | H01L 33/486 |
| | | | 257/E33.056 |
| 2010/0148210 A1* | 6/2010 | Huang | H01L 33/486 |
| | | | 438/26 |
| 2010/0182769 A1 | 7/2010 | Meersman | |
| 2011/0198659 A1* | 8/2011 | Han | H01L 24/29 |
| | | | 257/E33.057 |
| 2012/0205677 A1* | 8/2012 | Kobayakawa | H01L 33/62 |
| | | | 257/E25.02 |
| 2013/0181339 A1* | 7/2013 | Fan | H01L 24/81 |
| | | | 257/737 |
| 2013/0329425 A1 | 12/2013 | Lowes et al. | |
| 2014/0103289 A1 | 4/2014 | Liao et al. | |
| 2016/0190411 A1* | 6/2016 | Oh | H01L 27/156 |
| | | | 438/28 |
| 2016/0308102 A1* | 10/2016 | Zitzlsperger | H01L 33/54 |
| 2017/0022051 A1* | 1/2017 | Xue | H01L 24/32 |
| 2017/0133558 A1 | 5/2017 | Sasaki et al. | |
| 2017/0155021 A1* | 6/2017 | Fukuda | H01L 33/486 |
| 2017/0372927 A1* | 12/2017 | Schuele | H01L 29/0657 |
| 2018/0012872 A1* | 1/2018 | Okui | H01L 33/62 |
| 2019/0006564 A1* | 1/2019 | Sasaki | H01L 33/62 |
| 2019/0273006 A1 | 9/2019 | Schuele et al. | |
| 2020/0135999 A1* | 4/2020 | Daikoku | H01L 33/486 |
| 2020/0335675 A1* | 10/2020 | Kim | H01L 33/54 |
| 2020/0365783 A1* | 11/2020 | Lin | H01L 33/52 |
| 2021/0184087 A1* | 6/2021 | Tu | H01L 25/0753 |
| 2021/0202811 A1* | 7/2021 | Zimmerman | H01L 24/48 |
| 2021/0317958 A1* | 10/2021 | Kageyama | F21K 9/90 |

FOREIGN PATENT DOCUMENTS

| | | | | |
|---|---|---|---|---|
| DE | 102014119390 A1 * | 6/2016 | | H01L 33/52 |
| JP | H06-005926 A | 1/1994 | | |
| JP | H06-350206 A | 12/1994 | | |
| JP | 2002-93824 A | 3/2002 | | |
| JP | 2005-353802 A | 12/2005 | | |
| JP | 2009-130097 A | 6/2009 | | |
| JP | 2010-114403 A | 5/2010 | | |
| JP | 2013-182955 A | 9/2013 | | |
| JP | 2014-45098 A | 3/2014 | | |
| JP | 2014-135322 A | 7/2014 | | |
| JP | 2014-160742 A | 9/2014 | | |
| JP | 2016-149386 A | 8/2016 | | |
| JP | 2016-152309 A | 8/2016 | | |
| JP | 2016-212310 A | 12/2016 | | |
| JP | 2018-61017 A | 4/2018 | | |
| JP | 2018-78279 A | 5/2018 | | |
| JP | 2018-109736 A | 7/2018 | | |
| JP | 2019-521380 A | 7/2019 | | |
| JP | 2020-025034 A | 2/2020 | | |
| JP | 2020-525836 A | 8/2020 | | |
| JP | 2020-181971 A | 11/2020 | | |
| TW | M328670 U | 3/2008 | | |
| TW | 201322510 A1 | 6/2013 | | |
| TW | 201826490 A | 7/2018 | | |
| TW | 201826491 A | 7/2018 | | |
| TW | 202042287 A | 11/2020 | | |

* cited by examiner

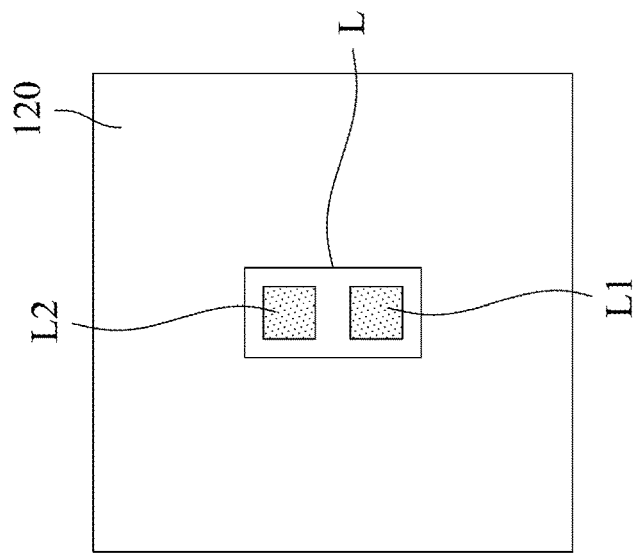
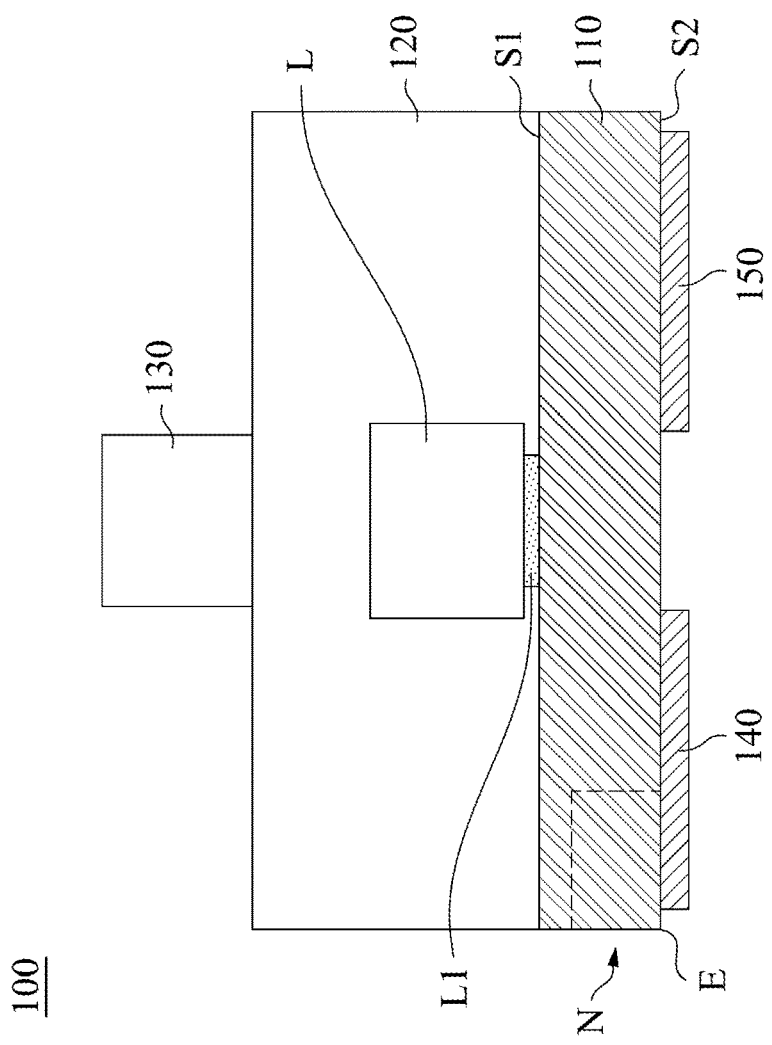

LIGHT EMITTING ELEMENT PACKAGE INCLUDING SUBSTRATE WITH EDGE NOTCH AND DISPLAY DEVICE INCLUDING LIGHT EMITTING ELEMENT PACKAGE

CROSS-REFERENCE TO RELATED APPLICATION

This application claims priority to Taiwan Application Serial Number 110104804, filed Feb. 8, 2021, which is herein incorporated by reference.

BACKGROUND

Field of Invention

The present disclosure relates to a light emitting element package and a display device and manufacturing method thereof.

Description of Related Art

A color display is usually composed of pixels that emit red light, green light, and blue light. For example, the display is a liquid crystal display, an organic light emitting diode display, or a micro light emitting diode (LED) display. The micro LED display uses micro LEDs to emit light. The biggest challenge in manufacturing the micro LED display is how to place a large number of micro LEDs in precise locations on the display substrate to form an array of pixels. For example, the method of placing the micro LEDs includes picking up the micro LEDs one by one from a supply substrate by a pick-and-place assembly and then placing the micro LEDs sequentially on the display substrate. Alternatively, the micro LEDs can be placed on the display substrate by using a mass transfer method, in which an auxiliary substrate is filled with the micro LEDs by using the auxiliary substrate as a press mold, and then the micro LEDs are placed on the display substrate by the press mold. However, the complexity and cost of the above techniques will increase rapidly as the pixel density increases and the size of the display decreases.

In view of the above, there is an urgent need for a new manufacturing method to overcome the above problems.

SUMMARY

The present disclosure provides a light emitting element package including a first substrate, at least one light emitting element, an encapsulation layer, and a plurality of conductive pads. The first substrate has an upper surface and a lower surface opposite to each other, and an edge of the lower surface has a notch. The at least one light emitting element is disposed on the upper surface of the first substrate, in which the light emitting element has a positive electrode and a negative electrode. The encapsulation layer covers the light emitting element. The plurality of conductive pads are disposed on the lower surface of the first substrate and electrically connected to the positive electrode and the negative electrode of the light emitting element, respectively.

In some embodiments, the at least one light emitting element includes a red light emitting element, a green light emitting element, and a blue light emitting element. The red light emitting element, the green light emitting element, and the blue light emitting element respectively have a positive electrode and a negative electrode.

In some embodiments, the plurality of conductive pads electrically connected to the positive electrodes and the negative electrodes of the red light emitting element, the green light emitting element, and the blue light emitting element, respectively.

In some embodiments, the plurality of conductive pads include a first conductive pad, a second conductive pad, a third conductive pad, and a fourth conductive pad. The first conductive pad is electrically connected to the positive electrode of the red light emitting element. The second conductive pad is electrically connected to the positive electrode of the green light emitting element. The third conductive pad is electrically connected to the positive electrode of the blue light emitting element. The fourth conductive pad is electrically connected to the negative electrodes of the red light emitting element, the green light emitting element, and the blue light emitting element.

In some embodiments, each of lower surfaces of the plurality of conductive pads is a polygon.

In some embodiments, lower surfaces of the plurality of conductive pads are substantially flush.

In some embodiments, the light emitting element package has a polygonal profile in a top view.

In some embodiments, the light emitting element package has a quadrilateral profile in the top view.

In some embodiments, the light emitting element package further includes a pillar disposed on the encapsulation layer.

In some embodiments, the light emitting element package further includes an adhesion layer disposed between the pillar and the encapsulation layer.

The present disclosure provides a display device including the light emitting element package in any one of previous embodiments, a second substrate, and a plurality of conductive contacts. The second substrate has a trench and a protruding portion, and the protruding portion extends from a sidewall of the trench. The plurality of conductive contacts are disposed on a bottom surface of the trench. The light emitting element package is disposed in the trench. The protruding portion of the second substrate is positioned in the notch of the first substrate of the light emitting element package. The plurality of conductive pads of the light emitting element package are electrically connected to plurality of conductive contacts, respectively.

In some embodiments, the at least one light emitting element includes a red light emitting element, a green light emitting element, and a blue light emitting element. The red light emitting element, the green light emitting element, and the blue light emitting element respectively have a positive electrode and a negative electrode.

In some embodiments, the plurality of conductive pads includes a first conductive pad, a second conductive pad, a third conductive pad, and a fourth conductive pad. The first conductive pad is electrically connected to the positive electrode of the red light emitting element. The second conductive pad is electrically connected to the positive electrode of the green light emitting element. The third conductive pad is electrically connected to the positive electrode of the blue light emitting element. The fourth conductive pad is electrically connected to the negative electrodes of the red light emitting element, the green light emitting element, and the blue light emitting element. The plurality of conductive contacts include four conductive contacts and are electrically connected to the first conductive pad, the second conductive pad, the third conductive pad, and the fourth conductive pad, respectively.

In some embodiments, shapes of the protruding portion and the notch substantially match.

In some embodiments, the trench has a polygonal profile in a top view.

The present disclosure provides a method of manufacturing a display device, and the method includes the following operations. (a) A first substrate and a plurality of conductive contacts are provided, in which the first substrate has a trench and a protruding portion, the protruding portion extends from a sidewall of the trench, and the plurality of conductive contacts are disposed on a bottom surface of the trench. (b) A liquid suspension including a light emitting element package is made to flow through an upper surface of the first substrate, in which the light emitting element package includes a second substrate, at least one light emitting element, an encapsulation layer, a pillar, and a plurality of conductive pads. The second substrate has an upper surface and a lower surface opposite to each other, and an edge of the lower surface has a notch. The at least one light emitting element is disposed on the upper surface of the second substrate, in which the light emitting element has a positive electrode and a negative electrode. The encapsulation layer covers the light emitting element. The pillar is disposed on the encapsulation layer. The plurality of conductive pads are disposed on the lower surface of the second substrate and electrically connected to the positive electrode and the negative electrode of the light emitting element, respectively. (c) The light emitting element package is disposed in the trench, in which the protruding portion of the first substrate is positioned in the notch of the second substrate.

In some embodiments, the method of manufacturing the display device further includes: after disposing the light emitting element package in the trench, removing the pillar from the encapsulation layer.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows:

FIG. 1A, FIG. 1C, and FIG. 2A are cross-sectional views of light emitting element packages according to various embodiments of the present disclosure.

FIG. 1B and FIG. 2B are structural views of light emitting elements in light emitting element packages in a top view according to various embodiments of the present disclosure.

DETAILED DESCRIPTION

Figure 1C:
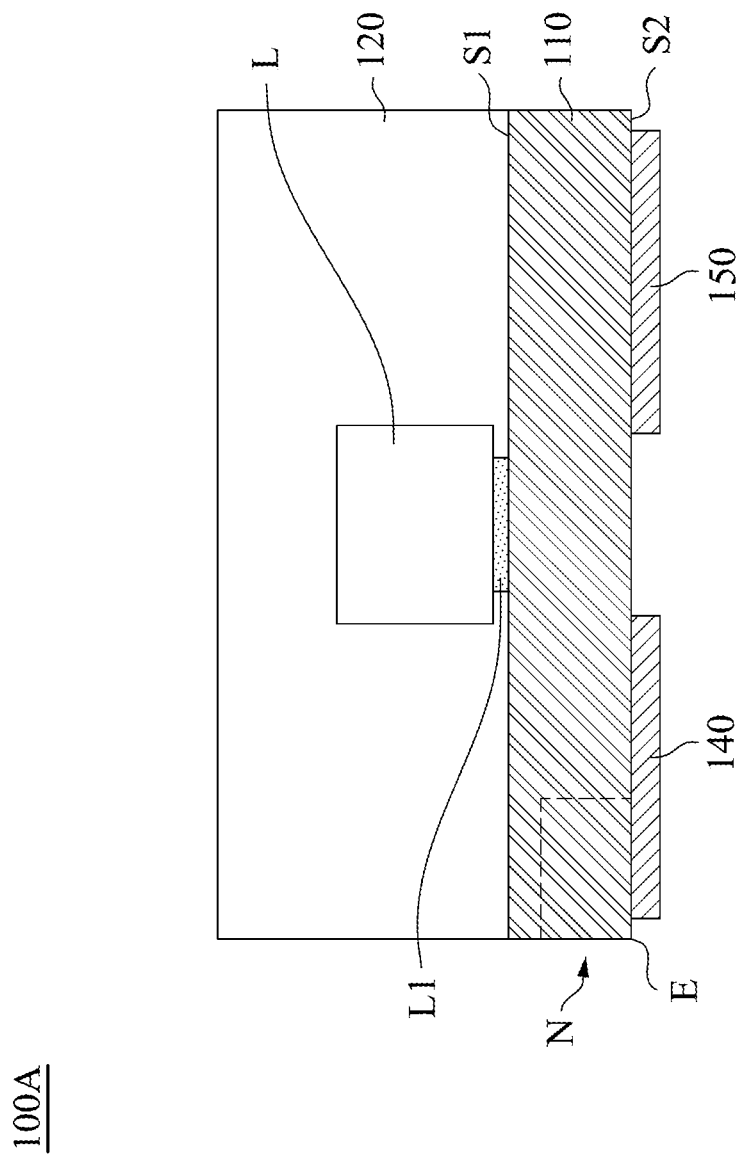

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

Although a series of operations or steps below are utilized to illustrate the methods disclosed herein, the order shown by these operations or steps should not be construed as a limitation of this disclosure. For example, certain operations or steps may be performed in a different order and/or in conjunction with other steps. In addition, not all of the operations, steps, and/or features illustrated must be performed in order to implement the embodiment of the disclosure. Further, each operation or step described herein may contain several sub-steps or actions.

The present disclosure provides a light emitting element package. Please refer to FIG. 1A and FIG. 1B. FIG. 1A is a cross-sectional view of a light emitting element package according to various embodiments of the present disclosure. FIG. 1B is a structural schematic view of a light emitting element in the light emitting element package in a top view according to various embodiments of the present disclosure.

As shown in FIG. 1A, a light emitting element package 100 includes a substrate 110, at least one light emitting element L, an encapsulation layer 120, conductive pads 140 and 150, and a pillar 130. The substrate 110 has an upper surface S1 and a lower surface S2 opposite to each other, and an edge E of the lower surface S2 has a notch N. The light emitting element L is disposed on the upper surface S1 of the substrate 110. The encapsulation layer 120 covers the light emitting element L. The pillar 130 is disposed on the encapsulation layer 120. The conductive pads 140 and 150 are disposed on the lower surface S2 of the substrate 110. As shown in FIG. 1B, the light emitting element L has a positive electrode L1 and a negative electrode L2. The conductive pads 140 and 150 shown in FIG. 1A are electrically connected to the positive electrode L1 and the negative electrode L2 of the light emitting element L shown in FIG. 1B, respectively. For example, the conductive pads 140 and 150 can electrically connected to the positive electrode L1 and the negative electrode L2 through wires (not shown) in the substrate 110, respectively. In other words, the substrate 110 is provided with a circuit layout for interconnecting the light emitting element L and a target substrate.

The light emitting element package 100 of the present disclosure can be installed in a trench of a substrate by means of fluid self-assembly to form a display device. It is worth noting that during the fluid self-assembly process, the encapsulation layer 120 isolates the light emitting element L from a liquid, which can protect the light emitting element L and prevent the collision between light emitting element packages 100 damages light emitting element L when the liquid flows. After installation, the pillar 130 is removed from the encapsulation layer 120. In some other embodiments, the light emitting element package 100 further includes an adhesion layer (not shown) disposed between the pillar 130 and the encapsulation layer 120. The process of installation by means of fluid self-assembly will be described in detail later.

Only one light emitting element L is shown in FIG. 1A, for example. However, the number of the light emitting element is not limited thereto. The number of light emitting element can be adjusted according to design requirements, such as two, three, four, etc., but is not limited thereto. In some embodiments, the light emitting element L is a red light emitting element, a green light emitting element, a blue light emitting element, or a white light emitting element, but is not limited thereto. Two conductive pads 140, 150 are shown in FIG. 1A, for example. However, the number of conductive pads is not limited thereto. The number of conductive pads can be adjusted according to design requirements or the number of light emitting elements, such as two, three, four, etc., but is not limited thereto.

In some embodiments, as shown in FIG. 1A, lower surfaces of the conductive pads 140 and 150 are substantially flush, but are not limited thereto. In some other embodiments, a thickness of the conductive pad 140 is greater than a thickness of the conductive pad 150. In still other embodiments, the thickness of the conductive pad 140 is less than the thickness of the conductive pad 150.

In some embodiments, each of the lower surfaces of the conductive pads 140 and 150 is a polygon, such as a triangle, a quadrilateral, a pentagon, or a hexagon, but is not limited thereto. In some other embodiments, each of the lower surfaces of the conductive pads 140 and 150 is a circle, an ellipse, or any other shape.

In some embodiments, the light emitting element package 100 has a polygonal profile in a top view, such as triangular, quadrilateral, pentagonal, or hexagonal, but is not limited thereto. In some other embodiments, the light emitting element package 100 has a circular, elliptical, or any other profile in the top view.

In some embodiments, the light emitting element package 100 does not include the pillar 130. As shown in FIG. 1C, FIG. 1C is a cross-sectional view of a light emitting element package 100A according to various embodiments of the present disclosure. The difference between the light emitting element package 100A and the light emitting element package 100 is that the encapsulation layer 120 of the light emitting element package 100A is not provided with a pillar.

Figure 2B:
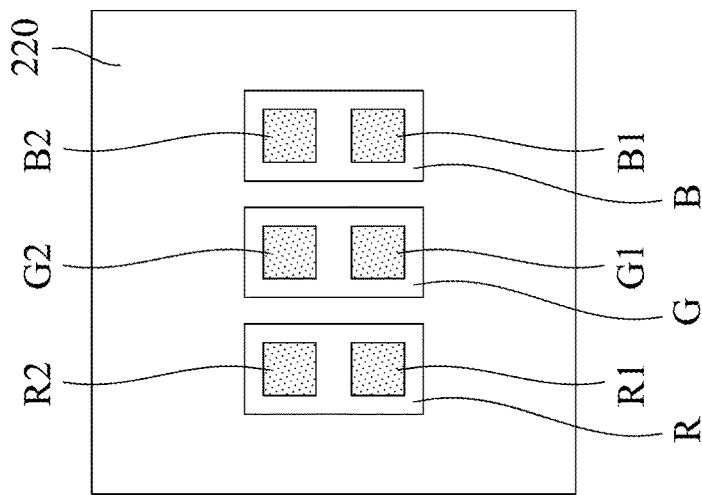
Figure 2A:
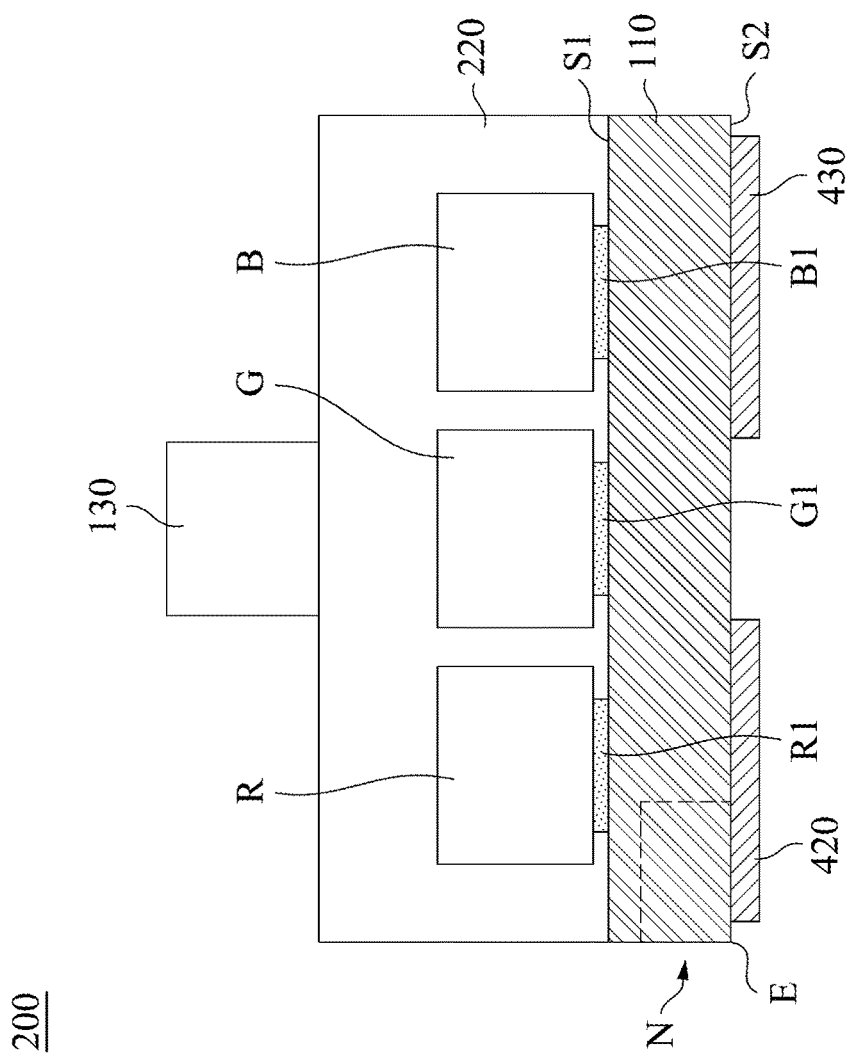

The present disclosure provides another light emitting element package. Please refer to FIG. 2A and FIG. 2B. FIG. 2A is a cross-sectional view of a light emitting element package according to various embodiments of the present disclosure. FIG. 2B is a structural view of light emitting elements in the light emitting element package in a top view according to various embodiments of the present disclosure.

As shown in FIG. 2A, a light emitting element package 200 includes the substrate 110, a red light emitting element R, a green light emitting element G, a blue light emitting element B, an encapsulation layer 220, conductive pads 420 and 430, and the pillar 130. The substrate 110 has the upper surface S1 and the lower surface S2 opposite to each other, and the edge E of the lower surface S2 has the notch N. The red light emitting element R, the green light emitting element G, and the blue light emitting element B are disposed on the upper surface S1 of the substrate 110. The encapsulation layer 220 covers the red light emitting element R, the green light emitting element G, and the blue light emitting element B. The pillar 130 is disposed on the encapsulation layer 220. The conductive pads 420 and 430 are disposed on the lower surface S2 of the substrate 110. As shown in FIG. 2B, the red light emitting element R has a positive electrode R1 and a negative electrode R2, the green light emitting element G has a positive electrode G1 and a negative electrode G2, and the blue light emitting element B has a positive electrode B1 and a negative electrode B2. The conductive pads 420 and 430 shown in FIG. 2A are electrically connected to the positive electrodes R1, G1, B1 and the negative electrodes R2, G2, and B2 of the red light emitting element R, the green light emitting element G, and the blue light emitting element B shown in FIG. 2B, respectively. For example, the conductive pads 420 and 430 can be electrically connected to the positive electrodes R1, G1, and B1, and the negative electrodes R2, G2, and B2 through wires (not shown) in the substrate 110, respectively. In other words, the substrate 110 is provided with a circuit layout for interconnecting the red light emitting element R, the green light emitting element G, and the blue light emitting element B with a target substrate.

Figure 4:
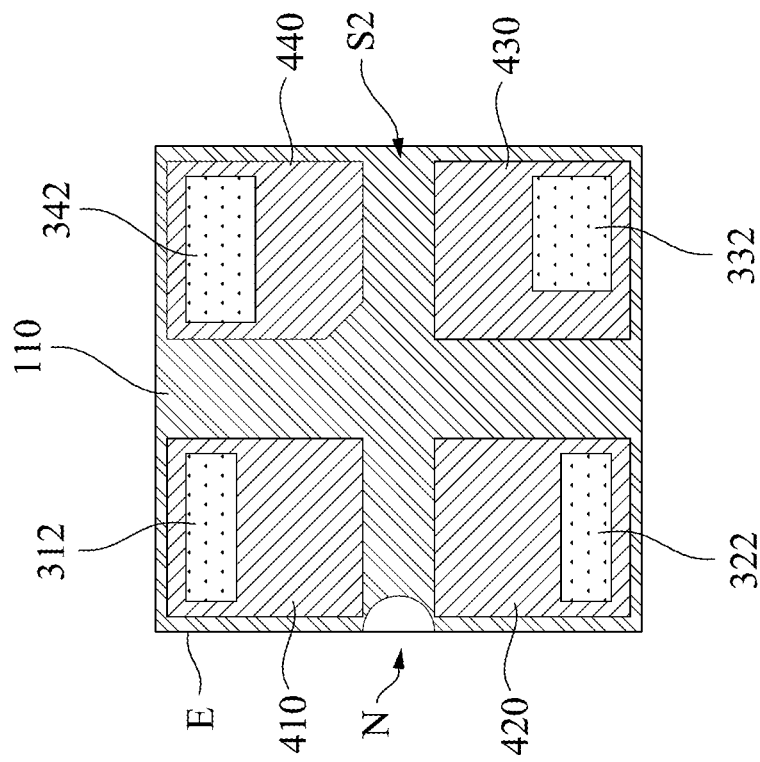
FIG. 3 and FIG. 4 are schematic views of wires of a substrate of a light emitting element package according to various embodiments of the present disclosure.
Figure 3:
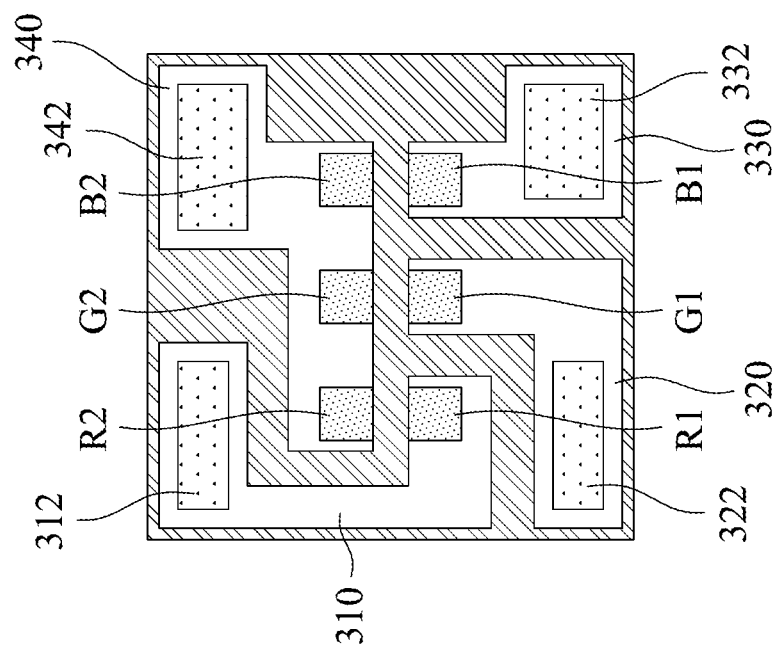

Please refer to FIG. 2B, FIG. 3, and FIG. 4. FIG. 3 and FIG. 4 are schematic views of wires of the substrate 110 of the light emitting element package 200 according to various embodiments of the present disclosure. The positive electrode R1 of the red light emitting element R is connected to a wire 310 under it. The wire 310 is connected to a conductive via 312 under it. The conductive via 312 is connected to a conductive pad 410 under it. The positive electrode G1 of the green light emitting element G is connected to a wire 320 under it. The wire 320 is connected to a conductive via 322 under it. The conductive via 322 is connected to a conductive pad 420 under it. The positive electrode B1 of the blue light emitting element B is connected to a wire 330 under it. The wire 330 is connected to a conductive via 332 under it. The conductive via 332 is connected to a conductive pad 430 under it. In addition, the negative electrodes R2, G2, and B2 of the red light emitting element R, the green light emitting element G, and the blue light emitting element B are connected to a wire 340 under the negative electrodes R2, G2, and B2. The wire 340 is connected to a conductive via 342 under it. The conductive via 342 is connected to a conductive pad 440 under it.

With the above-mentioned wiring structure design, the conductive pad 410 is electrically connected to the positive electrode R1 of the red light emitting element R. The conductive pad 420 is electrically connected to the positive electrode G1 of the green light emitting element G. The conductive pad 430 is electrically connected to the positive electrode B1 of the blue light emitting element B. The conductive pad 440 is electrically connected to the negative electrodes R2, G2, and B2 of the red light emitting element R, the green light emitting element G, and the blue light emitting element B. Four conductive pads 410, 420 and 430, and 440 are shown in FIG. 4, for example. However, the number of the conductive pads is not limited thereto. The number of conductive pads can be adjusted according to design requirements or the number of the light emitting elements, such as two, three, four, five, six, etc., but is not limited thereto.

The light emitting element package 200 of the present disclosure can be installed in a trench of a substrate by means of fluid self-assembly to form a display device. It is worth noting that during the fluid self-assembly process, the encapsulation layer 220 isolates the red light emitting element R, the green light emitting element G, and the blue light emitting element B from a liquid, which can protect the above-mentioned light emitting elements and prevent the collision between light emitting element packages 200 damages the above-mentioned light emitting elements when the liquid flows. After installation, the pillar 130 is removed from the encapsulation layer 220. In other words, in some embodiments, the light emitting element package 200 does not include the pillar 130. The process of installing the light emitting element package 200 by means of fluid self-assembly will be described in detail later.

For the embodiment of the light emitting element package 200 in FIG. 2A, reference may be made to the embodiment of the light emitting element package 100 in FIG. 1A. In some embodiments, the lower surfaces of the conductive pads 410, 420, 430, and 440 are substantially flush, but are not limited thereto. In some other embodiments, thicknesses of the conductive pads 410, 420, 430, and 440 are different. For example, the thickness of the conductive pad 440 is greater than the thicknesses of the conductive pads 410, 420, and 430, or the thickness of the conductive pad 440 is less than the thicknesses of the conductive pads 410, 420, and 430, but is not limited thereto.

In some embodiments, each of the lower surfaces of the conductive pads 410, 420, 430, and 440 is a polygon, such as a triangle, a quadrilateral, a pentagon, or a hexagon, but is not limited thereto. In some other embodiments, each of the lower surfaces of the conductive pads 410, 420, 430, and 440 is a circle, an ellipse, or any other shape.

In some embodiments, the light emitting element package 200 has a polygonal profile in a top view, such as triangular, quadrilateral, pentagonal, or hexagonal, but is not limited thereto. In some other embodiments, the light emitting element package 200 has a circular, elliptical, or any other profile in the top view.

Figure 5:
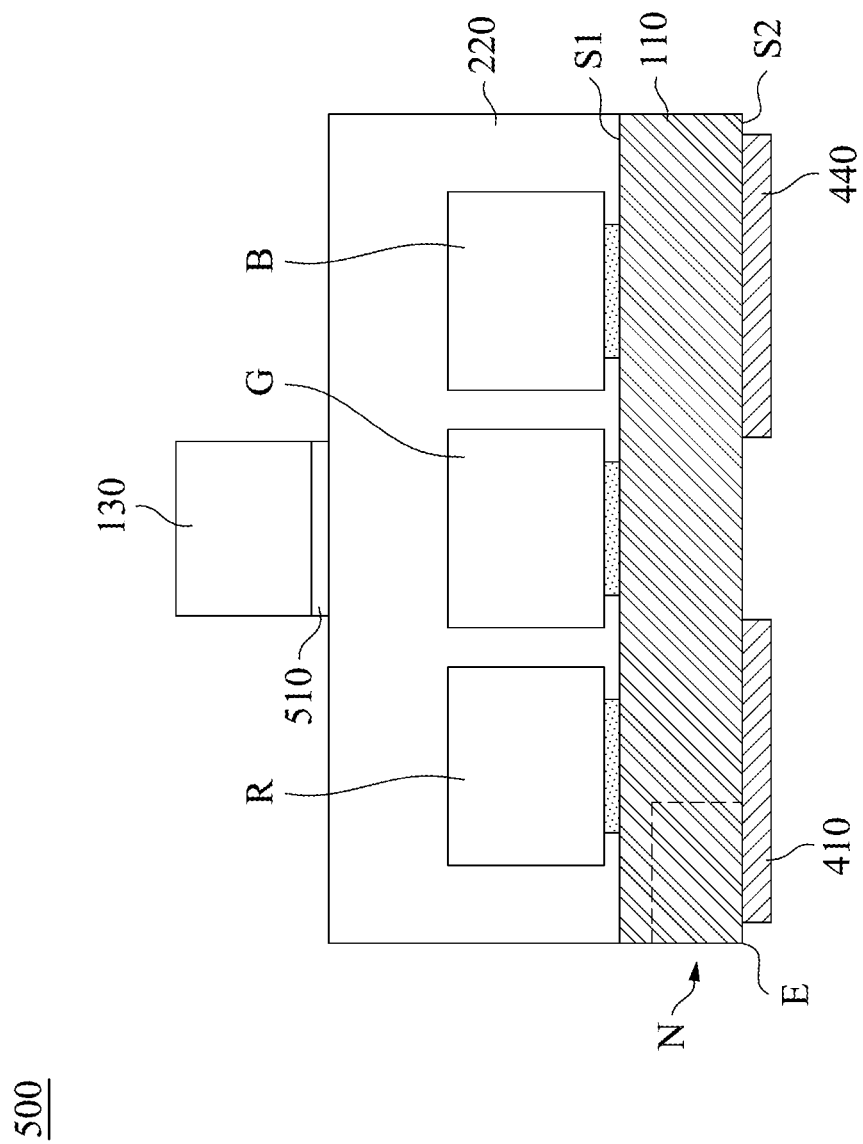
FIG. 5 is a cross-sectional view of a light emitting element package according to various embodiments of the present disclosure.

FIG. 5 is a cross-sectional view of a light emitting element package 500 according to various embodiments of the present disclosure. The difference between the light emitting element package 500 in FIG. 5 and the light emitting element package 200 in FIG. 2A is that the light emitting element package 500 further includes an adhesion layer 510 disposed between the pillar 130 and the encapsulation layer 220. The adhesion layer 510 can make the pillar 130 easily adhere to the encapsulation layer 220. For example, the adhesion layer 510 is silicon dioxide, but is not limited thereto. In some embodiments, the adhesion layer 510 may be wet etched to remove the pillar 130.

Figure 6:
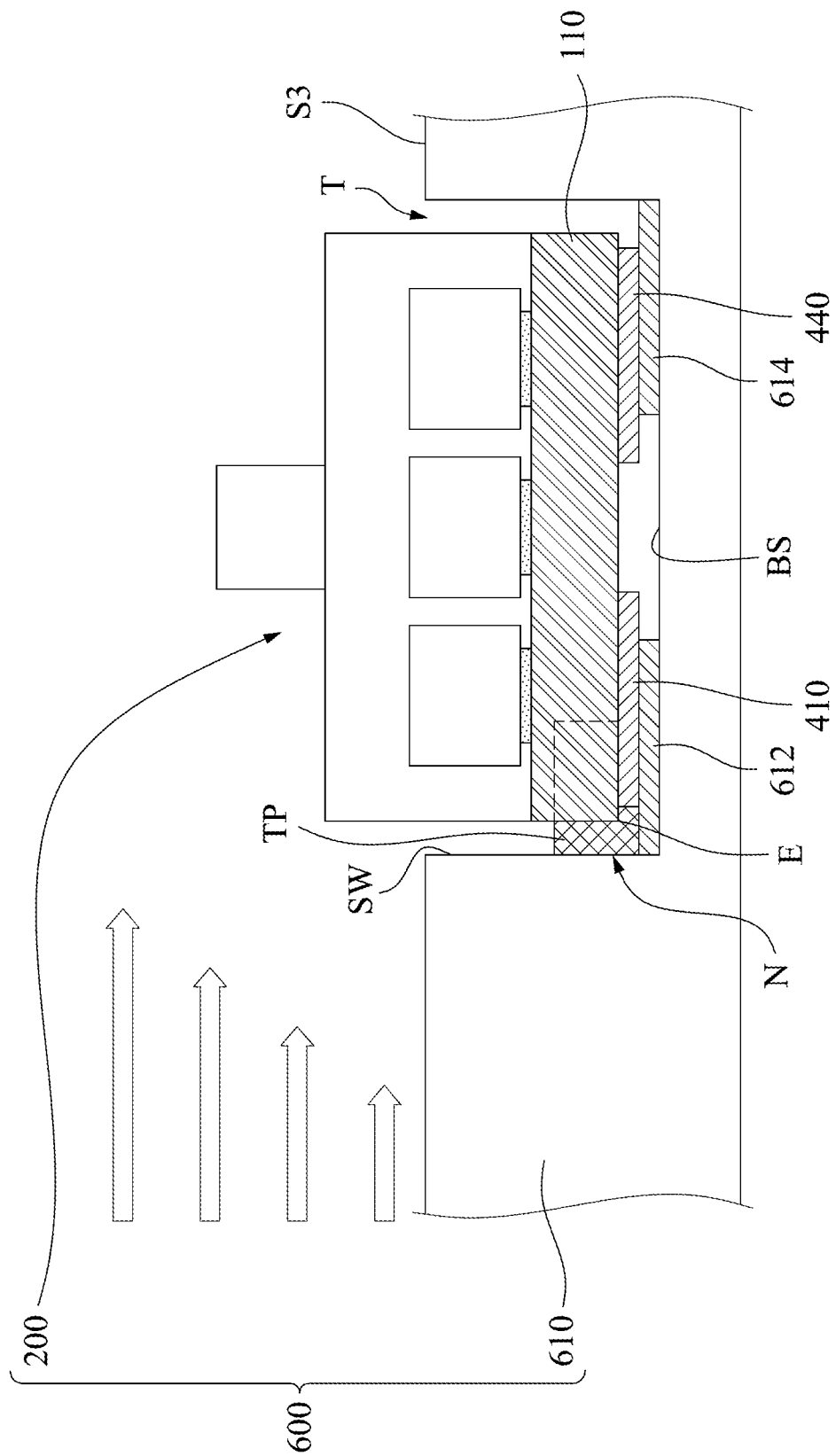
FIG. 6 is a cross-sectional view of a display device according to various embodiments of the present disclosure.

FIG. 6 is a cross-sectional view of a display device 600 according to various embodiments of the present disclosure. The display device 600 includes the light emitting element package 200 shown in FIG. 2, a substrate 610, and conductive contacts 612 and 614. The substrate 610 has a trench T and a protruding portion TP, and the protruding portion TP extends from a sidewall SW of the trench T. The conductive contacts 612 and 614 are disposed on a bottom surface BS of the trench T. The light emitting element package 200 is disposed in the trench T, and the protruding portion TP of the substrate 610 is positioned in the notch N of the substrate 110 of the light emitting element package 200.

Only one trench T is shown in FIG. 6, for example. However, the number of the trench T is not limited thereto. The number of the trench can be adjusted according to design requirements, and the substrate 610 may include trenches.

Figure 8:
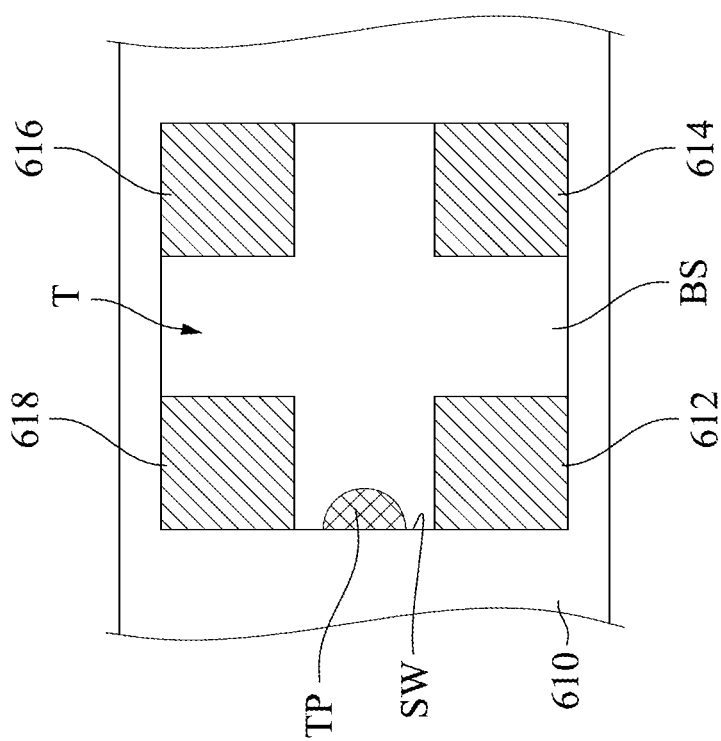
FIG. 8 is a top view of the substrate and the conductive contacts according to various embodiments of the present disclosure.
Figure 7:
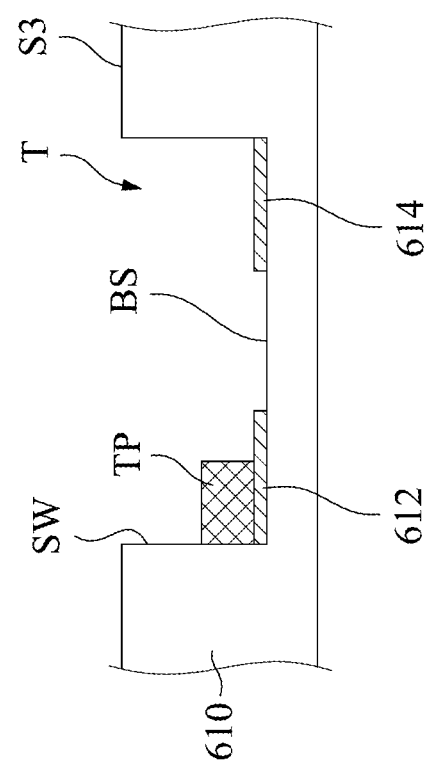
FIG. 7 is a cross-sectional view of a substrate and conductive contacts according to various embodiments of the present disclosure.

In order to understand the structure of the display device 600 more clearly, please refer to FIG. 4, FIG. 6, FIG. 7 and FIG. 8 at the same time. FIG. 7 is a cross-sectional view of the substrate 610 and the conductive contacts 612 and 614 according to various embodiments of the present disclosure. FIG. 8 is a top view of the substrate 610 and conductive contacts 612, 614, 616, and 618 according to various embodiments of the present disclosure. The light emitting element package 200 is disposed in the trench T. The conductive pads 410, 420 and 430, and 440 of the light emitting element package 200 are electrically connected to the conductive contacts 618, 612, 614, and 616, respectively.

Four conductive contacts 612, 614, 616, and 618 are shown in FIG. 8, for example. However, the number of conductive contacts is not limited thereto. The number of conductive contacts can be adjusted according to the design and number of the conductive pads, such as two, three, four, five, six, etc., but is not limited thereto. In some embodiments, the conductive contacts 612, 614, 616, and 618 are connected with wires (not shown) in the substrate 610 to regulate the light emission of the light emitting element package 200.

As shown in FIG. 8, in some embodiments, the trench T has a polygonal profile in a top view, such as triangular, quadrilateral, pentagonal, or hexagonal, but is not limited thereto. In some other embodiments, the trench T has a circular, elliptical, or any other profile in the top view. In some embodiments, shapes of the trench T and the light emitting element package 200 substantially match.

Please refer to FIG. 4 and FIG. 8 at the same time. In some embodiments, shapes of the protruding portion TP and the notch N substantially match. In some embodiments, a volume of the protruding portion TP is substantially equal to a volume of the notch N. In some other embodiments, the volume of the protruding portion TP is less than the volume of the notch N. When the light emitting element package 200 is to be installed in the trench T of the substrate 610, only when the protruding portion TP of the substrate 610 is aligned with the notch N of the substrate 110, the light emitting element package 200 will be installed in the trench T to ensure the conductive pads 410, 420, 430, and 440 of the light emitting element package 200 are connected to the conductive contacts 612, 614, 616, and 618 in the correct direction and polarity.

Figure 9:
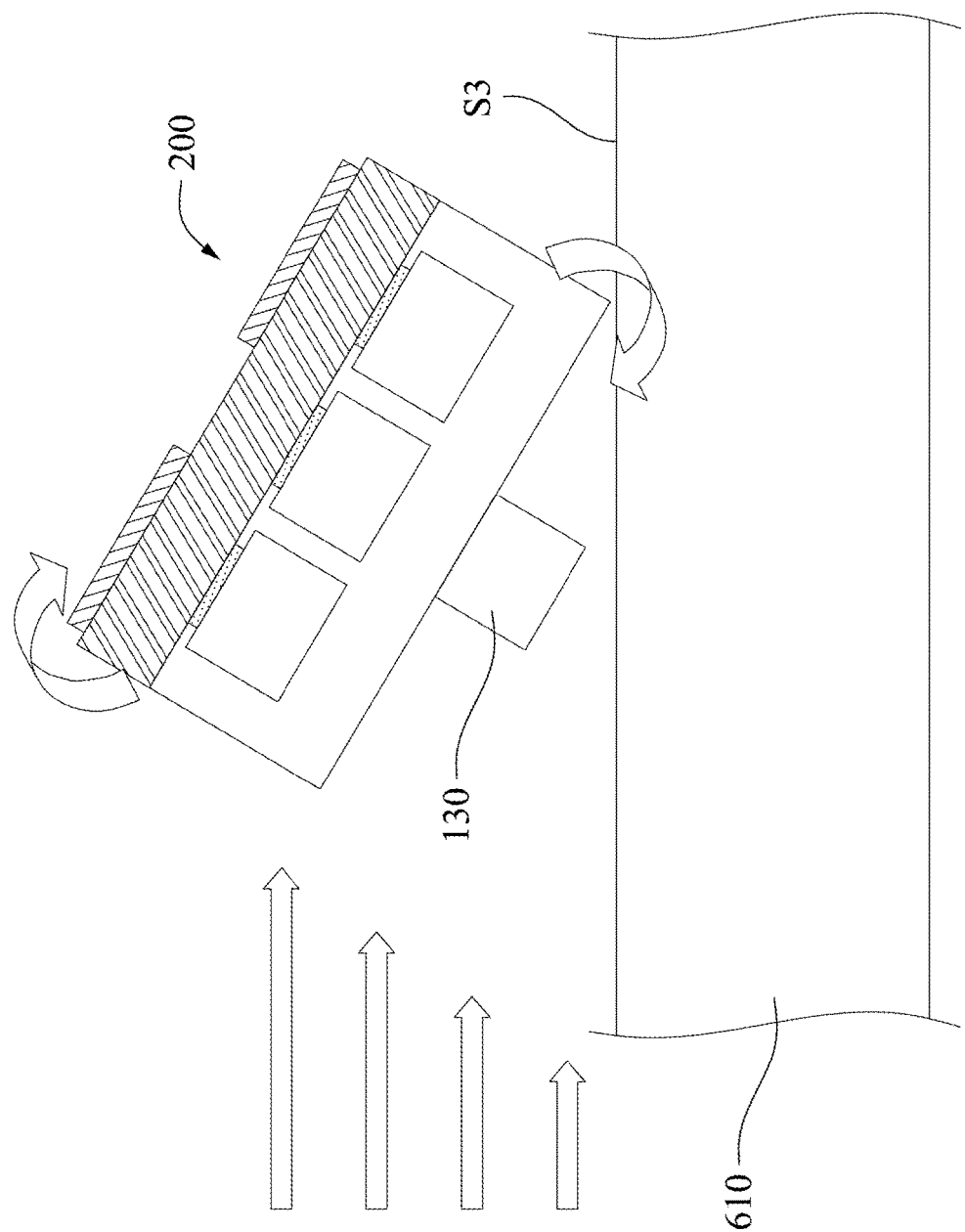
FIG. 9 and FIG. 10 are schematic views during manufacturing a display device according to various embodiments of the present disclosure.

This disclosure provides a method of manufacturing a display device. Please refer to FIG. 2A, FIG. 2B, and FIGS. 6-9. FIG. 9 is a schematic view during manufacturing the display device 600 according to various embodiments of the present disclosure. The method includes the following operations. (a) As shown in FIGS. 7-8, the substrate 610 and the conductive contacts 612, 614, 616, 618 are provided, in which the substrate 610 has the trench T and the protruding portion TP, and the protruding portion TP extends from sidewall SW of the trench T. The conductive contacts 612, 614, 616, and 618 are disposed on the bottom surface BS of the trench T. (b) As shown in FIG. 9, a liquid suspension containing the light emitting element package 200 is made to flow through the upper surface S3 of the substrate 610. Since the light emitting element package 200 has the pillar 130, when the pillar 130 touches the upper surface S3 of the substrate 610, the light emitting element package 200 will flip on the substrate 610 due to the liquid flow until it falls into the trench T. As shown in FIG. 2A and FIG. 4, the light emitting element package 200 includes the substrate 110, the red light emitting element R, the green light emitting element G, the blue light emitting element B, the encapsulation layer 220, the conductive pads 410, 420, 430, and 440, and the pillar 130. The substrate 110 has the upper surface S1 and the lower surface S2 opposite to each other, and the edge E of the lower surface S2 has the notch N. The red light emitting element R, the green light emitting element G, and the blue light emitting element B are disposed on the upper surface S1 of the substrate 110. The encapsulation layer 220 covers the red light emitting element R, the green light emitting element G, and the blue light emitting element B. The pillar 130 is disposed on the encapsulation layer 220. The conductive pads 410, 420, 430, and 440 are disposed on the lower surface S2 of the substrate 110. As shown in FIG. 2B, the red light emitting element R has the positive electrode R1 and the negative electrode R2, the green light emitting element G has the positive electrode G1 and the negative electrode G2, and the blue light emitting element B has the positive electrode B1 and the negative electrode B2. The conductive pads 410, 420, 430, and 440 are electrically connected to the positive electrodes R1, G1, and B1, and negative electrodes R2, G2, and B2 of the red light emitting element R, the green light emitting element G, and the blue light emitting element B, respectively. (c) As shown in FIG. 6, the light emitting element package 200 is disposed in the trench T, in which the protruding portion TP of the substrate 610 is positioned in the notch N of the substrate 110. In detail, when the light emitting element package 200 rolls to the trench T of the substrate 610, it will fall into the trench T. Moreover, only when the protruding portion TP of the substrate 610 is aligned with the notch N of the substrate 110, the light emitting element package 200 can be disposed in the trench T to ensure that the conductive pads 410, 420, 430, and 440 of the light emitting element package 200 are connected to the conductive contacts 612, 614, 616, and 618 in the correct direction and polarity.

In some embodiments, after disposing the light emitting element package 200 in the trench T, the pillar 130 is removed from the encapsulation layer 220.

Figure 10:
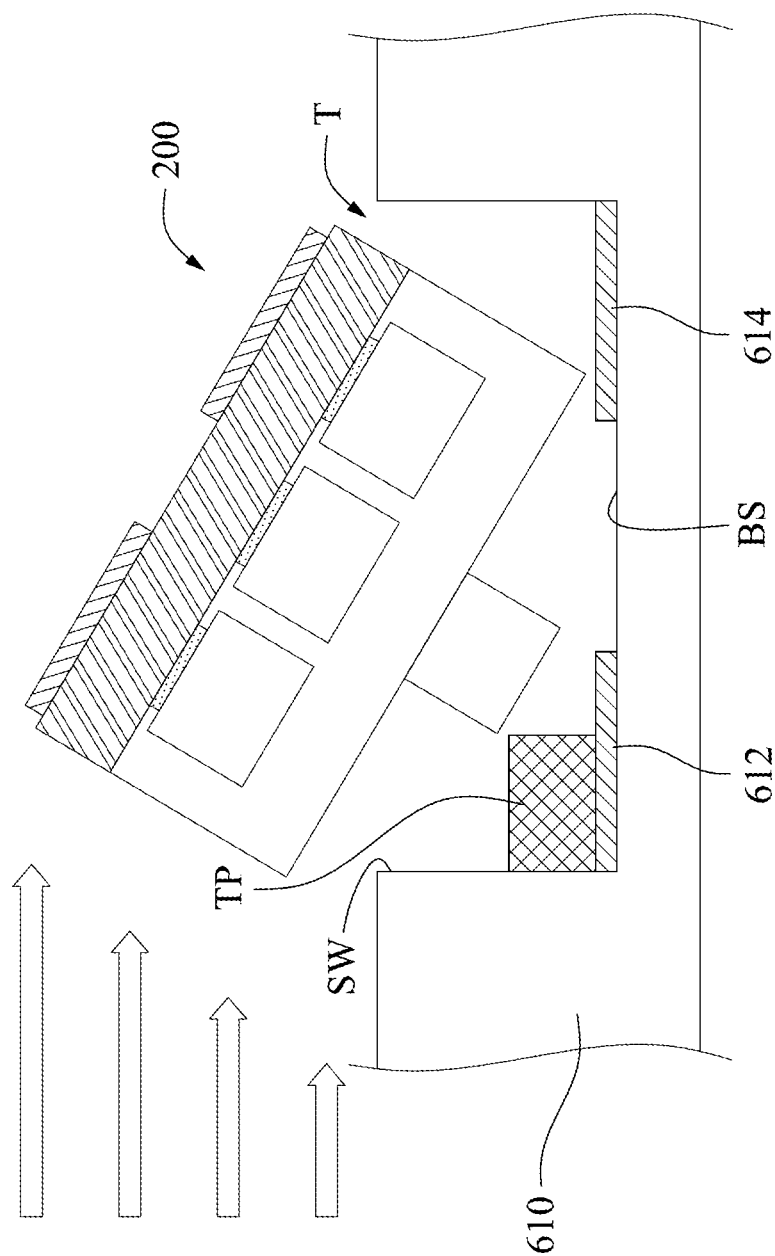

FIG. 10 is a schematic view during manufacturing the display device 600 according to various embodiments of the present disclosure. As shown in FIG. 10, when the light emitting element package 200 falls into the trench T, the conductive pads 410, 420, 430, and 440 of the light emitting element package 200 do not fall into the trench T downward, so the light emitting element package 200 cannot be disposed in the trench T. The light emitting element package 200 will be driven by the liquid suspension to leave the trench T and to continue to roll on the substrate 610. The light emitting element package 200 may fall into another trench. Similarly, if the conductive pads 410, 420, 430, and 440 of the light emitting element package 200 fall into the trench T, and the protruding portion TP of the substrate 610 is not aligned with the notch N of the substrate 110, the light emitting element package 200 cannot be disposed in the trench T. The light emitting element package 200 will be driven by the liquid suspension to leave the trench T. The design of the protruding portion TP and notch N of the present disclosure can prevent the light emitting element package 200 from being incorrectly connected to the conductive contacts, thereby improving manufacturing yield.

When manufacturing a display device, the above-mentioned fluid self-assembly method can be used to install light emitting element packages with different light emitting colors in a substrate with multiple trenches. For example, light emitting element packages emitting red light is first installed in a part of the trenches of the substrate, light emitting element packages emitting green light is installed in another part of trenches of the substrate, and then light emitting element packages emitting blue light is installed in the remaining trenches of the substrate. A display device is formed. Therefore, three transfers are required to manufacture the display device using the above-mentioned process. It is worth noting that when making a display device, the above-mentioned fluid self-assembly method can use the light emitting element package 200 containing three different colors of light emitting element as a transfer unit. The light emitting element packages 200 can be installed in the trenches of the substrate at one time. Therefore, only one transfer is required to manufacture the display device using the above-mentioned process. The light emitting element package 200 is a light emitting unit that emits white light. Therefore, compared to the way of multiple installations, the time required for the light emitting element packages 200 of the present disclosure is only ⅓ of the time required for the multiple installations. Therefore, the structural design of the light emitting element package 200 of the present disclosure can greatly reduce manufacturing costs, greatly save manufacturing time, and increase assembly speed. For example, the assembly speed can exceed 50 million transfer units per hour. The manufacturing method of the present disclosure can be used to produce a LED display with small pitches or high pixels per inch (PPI).

In summary, the structural design of the protruding portion and notch in the light emitting element package of the present disclosure can ensure that the conductive pads and the conductive contacts of the light emitting element package are connected in the correct direction and polarity, thereby enhancing the manufacturing yield. In addition, the method of manufacturing the display device of the present disclosure can realize the massive transfer of packages to a substrate by means of fluid self-assembly, thereby greatly reducing the manufacturing cost and greatly saving the manufacturing time, which is greatly helpful for production of a display device.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting element package, comprising:
   a first substrate having an upper surface and a lower surface opposite to each other, an edge of the lower surface having a notch;
   at least one light emitting element disposed on the upper surface of the first substrate, wherein the at least one light emitting element comprises a red light emitting element, a green light emitting element, and a blue light emitting element, and the red light emitting element, the green light emitting element, and the blue light emitting element respectively have a positive electrode and a negative electrode;
   an encapsulation layer covering the at least one light emitting element; and
   a plurality of conductive pads disposed on the lower surface of the first substrate and electrically connected to the positive electrodes and the negative electrodes of the red light emitting element, the green light emitting element, and the blue light emitting element, respectively.

2. The light emitting element package of claim 1, wherein the plurality of conductive pads electrically connected to the positive electrodes and the negative electrodes of the red light emitting element, the green light emitting element, and the blue light emitting element, respectively.

3. The light emitting element package of claim 2, wherein the plurality of conductive pads comprise a first conductive pad, a second conductive pad, a third conductive pad, and a fourth conductive pad, the first conductive pad is electrically connected to the positive electrode of the red light emitting element, the second conductive pad is electrically connected to the positive electrode of the green light emitting element, the third conductive pad is electrically connected to the positive electrode of the blue light emitting element, and the fourth conductive pad is electrically connected to the negative electrodes of the red light emitting element, the green light emitting element, and the blue light emitting element.

4. The light emitting element package of claim 1, wherein each of lower surfaces of the plurality of conductive pads is a polygon.

5. The light emitting element package of claim 1, wherein lower surfaces of the plurality of conductive pads are substantially flush.

6. The light emitting element package of claim 1, wherein the light emitting element package has a polygonal profile in a top view.

7. The light emitting element package of claim 6, wherein the light emitting element package has a quadrilateral profile in the top view.

8. The light emitting element package of claim 1, further comprising a pillar disposed on the encapsulation layer.

9. The light emitting element package of claim 8, further comprising an adhesion layer disposed between the pillar and the encapsulation layer.

10. A display device, comprising:
the light emitting element package of claim 1;
a second substrate having a trench and a protruding portion, the protruding portion extending from a sidewall of the trench; and
a plurality of conductive contacts disposed on a bottom surface of the trench,
wherein the light emitting element package is disposed in the trench, the protruding portion of the second substrate is positioned in the notch of the first substrate of the light emitting element package, and the plurality of conductive pads of the light emitting element package are electrically connected to plurality of conductive contacts, respectively.

11. The display device of claim 10, wherein the plurality of conductive pads comprise a first conductive pad, a second conductive pad, a third conductive pad, and a fourth conductive pad, the first conductive pad is electrically connected to the positive electrode of the red light emitting element, the second conductive pad is electrically connected to the positive electrode of the green light emitting element, the third conductive pad is electrically connected to the positive electrode of the blue light emitting element, the fourth conductive pad is electrically connected to the negative electrodes of the red light emitting element, the green light emitting element, and the blue light emitting element, and the plurality of conductive contacts comprise four conductive contacts and are electrically connected to the first conductive pad, the second conductive pad, the third conductive pad, and the fourth conductive pad, respectively.

12. The display device of claim 10, wherein shapes of the protruding portion and the notch substantially match.

13. The display device of claim 10, wherein the trench has a polygonal profile in a top view.

* * * * *